(12) United States Patent  
Toyoda

(10) Patent No.: US 6,462,328 B2  
(45) Date of Patent: Oct. 8, 2002

(54) PHOTO-DETECTION SENSOR AND METHOD OF MANUFACTURING THE SAME

(75) Inventor: Inao Toyoda, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/920,720

(22) Filed: Aug. 3, 2001

(65) Prior Publication Data

US 2002/0020802 A1 Feb. 21, 2002

(30) Foreign Application Priority Data

Aug. 8, 2000 (JP) ........................................ 2000-239858

(51) Int. Cl.$^7$ ................................................ H01J 40/14
(52) U.S. Cl. ........................ 250/214.1; 257/433; 438/48
(58) Field of Search ............................ 250/214.1, 208.1; 257/434, 433, 435, 465, 290, 444, 446, 53, 415, 417–419; 438/59, 73, 48, 54, 69, 70, 64, 65

(56) References Cited

U.S. PATENT DOCUMENTS 4,796,072 A * 1/1989 Higashi et al. .......... 250/208.1
5,594,236 A 1/1997 Suzuki et al.
5,932,921 A * 8/1999 Sakai et al. .................. 257/419
6,150,704 A * 11/2000 Kozuka ....................... 257/434
6,333,544 B1 * 12/2001 Toyoda et al. ............... 257/431

FOREIGN PATENT DOCUMENTS

JP  A-8-18091   1/1996
JP  A-9-298285  11/1997

* cited by examiner

Primary Examiner—Kevin Pyo  
Assistant Examiner—Sey C. Sohn  
(74) Attorney, Agent, or Firm—Law Offices of David G. Posz

(57) ABSTRACT

In a sensor chip for forming the light receiving elements of a photo-detection sensor, p-type regions of the photodiodes are formed in a surface portion of an n-type epitaxial layer, and they are respectively contacted with electrodes. A deep n$^+$-region is formed in the part of the n-type epitaxial layer between the adjacent p-type regions so as to reach a buried n$^+$-region. Carriers created with the projection of light in the photodiodes are trapped by the deep n$^+$-region (30). An aluminum film serving as a light shielding film is arranged over the part of a silicon substrate between the regions for forming the photodiodes. Thus, the photodiodes can be operated independently from each other.

5 Claims, 11 Drawing Sheets

PHOTO-DETECTION SENSOR AND METHOD OF MANUFACTURING THE SAME

CROSS REFERENCE TO RELATED APPLICATIONS

This application is based upon Japanese Patent Application Nos. 2000-239858 filed on Aug.8, 2000, the contents of which are incorporated herein by reference.

BACKGROUND OF THE INVENTION

1. Field of the Invention:

This invention relates to a photo-detection sensor, which can be applied to, for example, a photo-detection sensor for a vehicle, and more particularly, applied to a photo-detection sensor for a light control system or a solar radiation sensor for an air conditioner in the vehicle.

2. Related Art:

It has heretofore been known to fabricate a plurality of light receiving elements in one chip (refer to, for example, Japanese Patent Laid-Open No. 03-311084). In case of adopting this structure, it is posed as a problem how the light receiving elements are isolated in order to operate individual light receiving elements independently. Concretely, the crosstalk, between the respective light receiving elements, appear as a drawback. As a method for solving the problem, the inventors of the present invention have supposed that an n-type epitaxial layer is formed on a p-type substrate, that parts of the n-type epitaxial layer are surrounded with p-type regions in order to form islands, and that the light receiving elements are formed in the respective islands. That is, the elements can be made perfectly independent by forming the islands which are reliably isolated by the p-type isolation layers.

Such a construction, however, incurs a drawback that the isolation distance between the elements lengthens so that a chip size is enlarged.

Besides, a drawback appears, which hampers the independent operations of the respective light receiving elements in the case of forming the plurality of light receiving elements within one chip. This drawback is caused by the fact that light projected on the vicinity of the isolation portion between the light receiving elements reaches the light receiving portions of the respective light receiving elements on both the sides because of scattering, thereby influencing on the outputs of the light receiving elements. In this manner, the above construction incurs the drawback that the optical isolation between the light receiving elements worsens.

SUMMARY OF THE INVENTION

An object of the present invention is to provide a photo-detection sensor in which individual light receiving elements can be independently operated by a novel construction.

According to first aspect of the present invention, at least one trap region is formed in a part between regions for forming a plurality of light receiving elements, and carriers generated with the projection of light in the light receiving elements are trapped by the trap region. In this way, the crosstalk between adjacent light receiving elements is suppressed, and the respective light receiving elements can be operated independently.

The plurality of light receiving elements are so fabricated that the p-type regions of the respective light receiving elements are formed in the surface layer parts of an n-type region common to the light receiving elements, and that electrodes of the respective elements are arranged in the corresponding p-type regions. Besides, the trap region is formed as a heavily-doped n-type region which is formed in a part of the common n-type region between the adjacent p-type regions. Such a structure is advantageous as explained below. When elements are made independent by forming islands which are isolated by p-type isolation layers, the isolation distance between the elements lengthens to enlarge a chip size. In contrast, according to the present invention, one light receiving element is not disposed in one island, but the plurality of light receiving elements are formed in one island and are isolated by the trap region, whereby the enlargement of the chip size can be avoided.

Further, owing to a structure in which the trap region reaches a buried heavily-doped n-type region, the light receiving elements can be isolated more perfectly.

According to second aspect of the present invention, at least one light shielding film is arranged on a area between regions for forming a plurality of light receiving elements. The light shielding film can avoid the scattering of light projected on an area between the adjacent light receiving elements, and scattered light does not reach the light receiving portions of the light receiving elements on both the sides. As a result, outputs of the light receiving elements are prevented from being influenced by the scattered light. Thus, the light receiving elements are optically isolated, and the respective light receiving elements can be independently operated.

In this way, the crosstalk between the light receiving elements can be suppressed, while the light receiving elements are optically isolated without fail, so that the respective light receiving elements can be independently operated.

Other objects, features and advantages of the present invention will become more apparent from the following detailed description made with reference to the accompanying drawings.

DETAILED DESCRIPTION OF THE PREFERRED EMBODIMENTS

Figure 1:
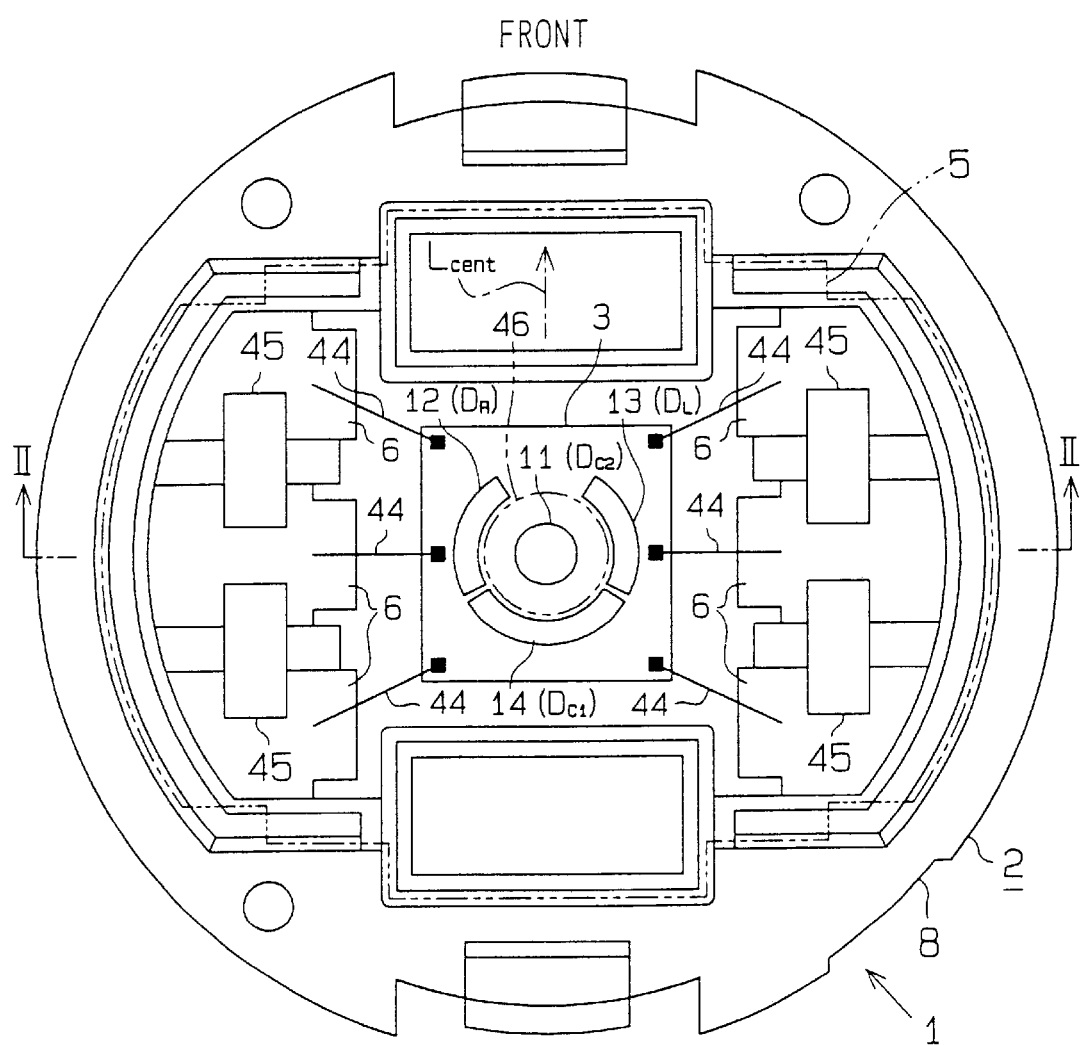
FIG. 1 is a plan view of a photo-detection sensor in an embodiment of this invention.

Specific embodiments of the present invention will now be described hereinafter with reference to the accompanying drawings in which the same or similar component parts are designated by the same or similar reference numerals.

A photo-detection sensor mounted on a vehicle in this embodiment of the present invention is employed to an automatic air conditioning system in the vehicle. The automatic air conditioning system is capable of independently controlling temperature for right and left sides occupants on front seats for a driver and a passenger. When the occupants set temperatures in the room of the vehicle at desired points, the air conditioning system performs the right and left independent temperature controls to automatically regulate temperatures of blowing air, amounts of the blowing air, or the like thereof. Thus, the temperature on the side on which solar radiation impinges is lowered to automatically compensate for influence ascribable to the intensity of the solar radiation, and to keep in-room temperature constant at all times.

Figure 2:
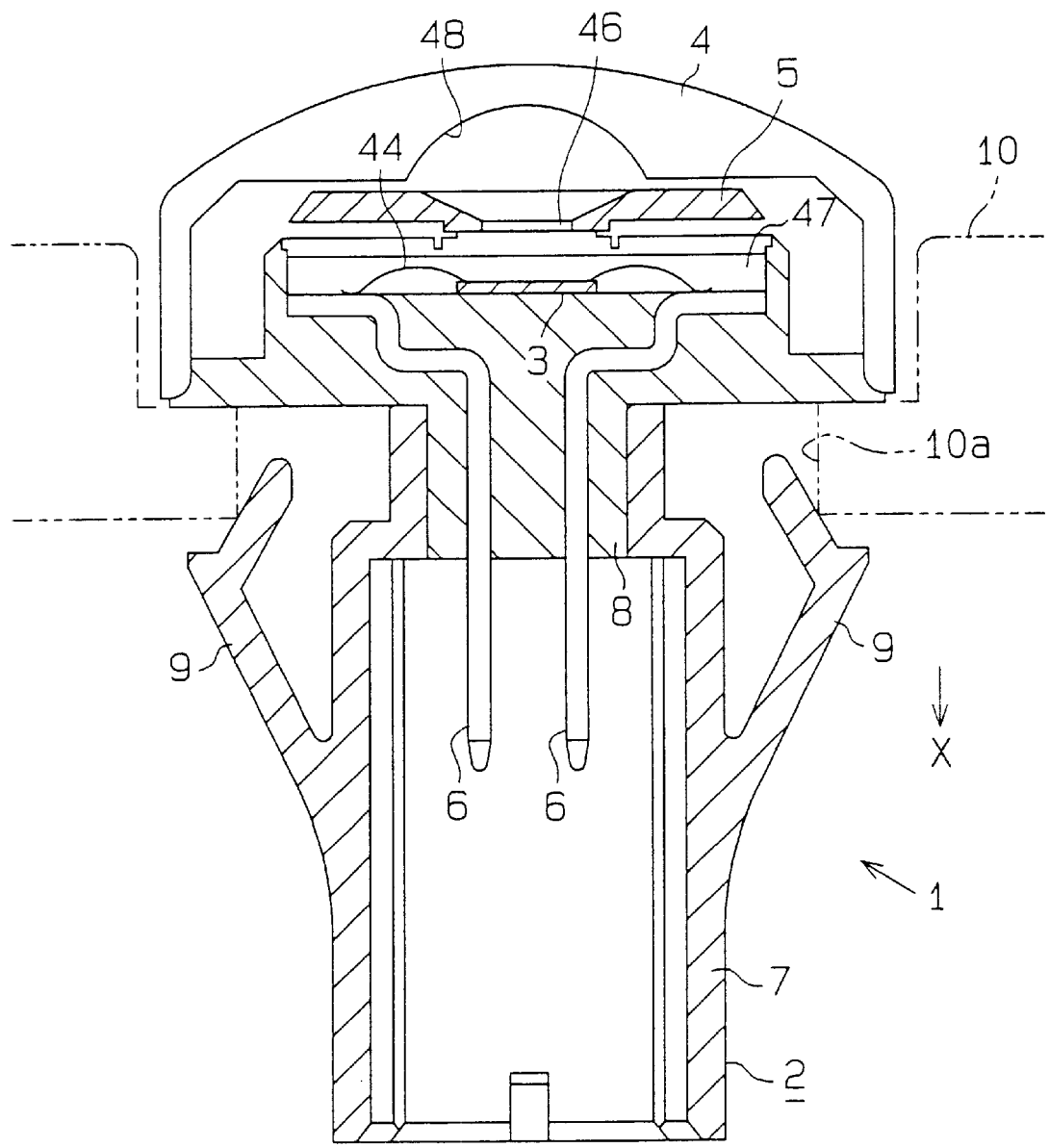
FIG. 2 is a sectional view taken along line II—II indicated in FIG. 1.

Referring to FIG. 1, an optical lens (filter) 4 and a douser 5 shown in FIG. 2 are detached. In FIG. 1, an arranged position of the douser 5 is indicated by a two-dot chain line.

Referring to FIG. 2, the photo-detection sensor 1 includes a housing 2 serving also as a connector, a sensor chip 3, the optical lens 4, the douser (shading plate) 5, and terminals 6. The housing 2 is configured of a case 7 and a holder 8, and both the members 7, 8 are made of a synthetic resin. The case 7 is in a cylindrical shape, and is mounted in a dash board of the vehicle in an upright state. Besides, the holder 8 is snugly fitted in an upper part of the case 7. Here, since the housing 2 is configured of the case 7 and the holder 8, the case 7 can be employed as a common member in each individual photo-detection sensor, and user only change the holder 8 (light receiving element-packaging portions and connector portions) in accordance with specifications of photo-detection sensors.

As shown in FIG. 2, the outer peripheral surface of the case 7 is provided with sensor mounting claws 9. The photo-detection sensor 1 is inserted into the sensor mounting hole 10a of the dash panel 10 of an automobile in a direction X indicated in FIG. 2, whereby the photo-detection sensor 1 is mounted on the dash panel 10 by the outward urging force of the sensor mounting claws 9.

The sensor chip 3 is arranged on the central part of the upper surface of the holder 8. Besides, the terminals 6 which are external output terminals for externally outputting detection signals are insert-molded in the holder 8, whereby the terminals 6 are held by the holder 8. One end of each of the terminals 6 is exposed to the upper surface of the holder 8, while the other end thereof is protruded from the lower surface of the holder 8.

Referring to FIG. 1 (also to FIG. 3), on the sensor chip 3 which is in a square shape, a right-incident light detecting photodiode $D_R$ and a left-incident light detecting photodiode $D_L$ are respectively arranged on the left side and right side of a reference axis $L_{cent}$ having a direction angle of "zero", and central detecting photodiodes $D_{C1}$ and $D_{C2}$ are arranged on the reference axis $L_{cent}$. The photodiodes $D_R$, $D_L$, $D_{C1}$ and $D_{C2}$ output signals corresponding to amounts of incident light (solar radiation intensities), respectively.

The details of the sensor chip 3 will be described with reference to FIGS. 3 and 4. The sensor chip 3 is an optical IC which includes a signal processing circuit 16, in addition to the photodiodes $D_R$, $D_L$, $D_{C1}$ and $D_{C2}$ as the light receiving elements. The sensor chip 3 has a circular light receiving region 11 which is located centrally of the chip 3, and p-type regions 12, 13, 14 in the shapes of circular arcs which surround the region 11. The respective regions 11 to 14 are electrically insulated. More specifically, as shown in FIG. 4, a silicon substrate 15 consists of a p-type silicon substrate 15a, and an n-type epitaxial layer 15b formed thereon. The p-type regions 11, 12, 13, 14 are formed in the surface layer of the n-type epitaxial layer 15b. The photodiode $D_R$ is constituted by the p-type region 12, the photodiode $D_L$ is constituted by the p-type region 13, and the photodiodes $D_{C1}$, $D_{C2}$ are respectively constituted by the p-type regions 14, 11. Accordingly, the p-type regions 11–14 act as light receiving portions in the sensor chip 3. Further, as indicated by a two-dot chain line in FIG. 3, the signal processing circuit 16 is fabricated (integrated) in the part of the sensor chip 3 other than the light receiving portions 11–14 (around the light receiving portions).

Figure 3:
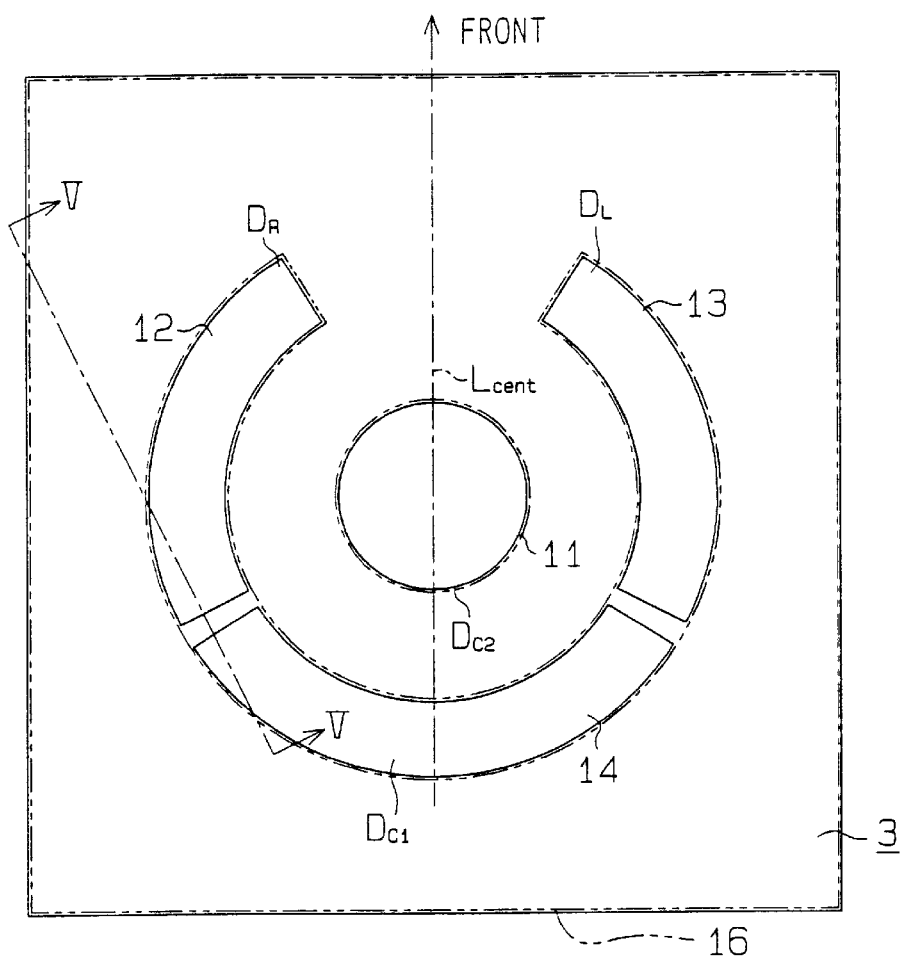
FIG. 3 is a plan view of a sensor chip.
Figure 4:
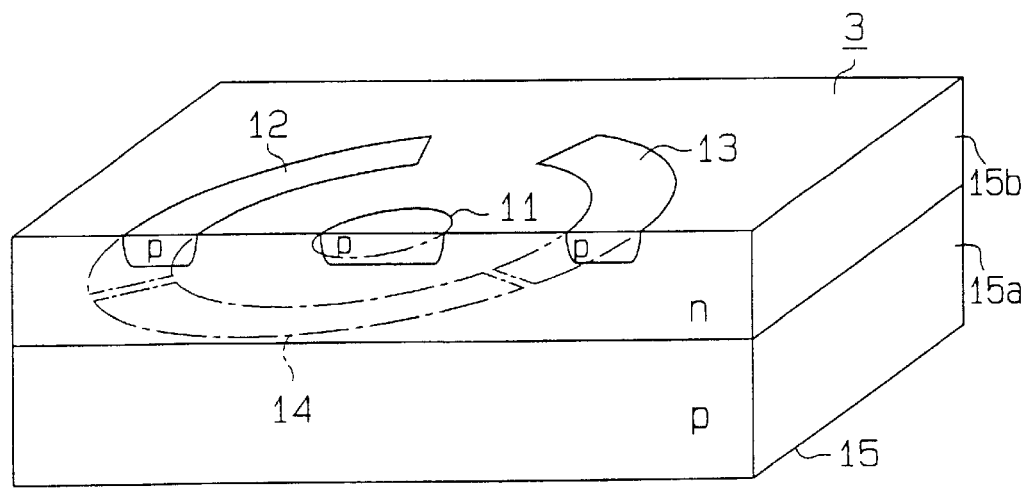
FIG. 4 is an explanatory view of the sensor chip.
Figure 5:
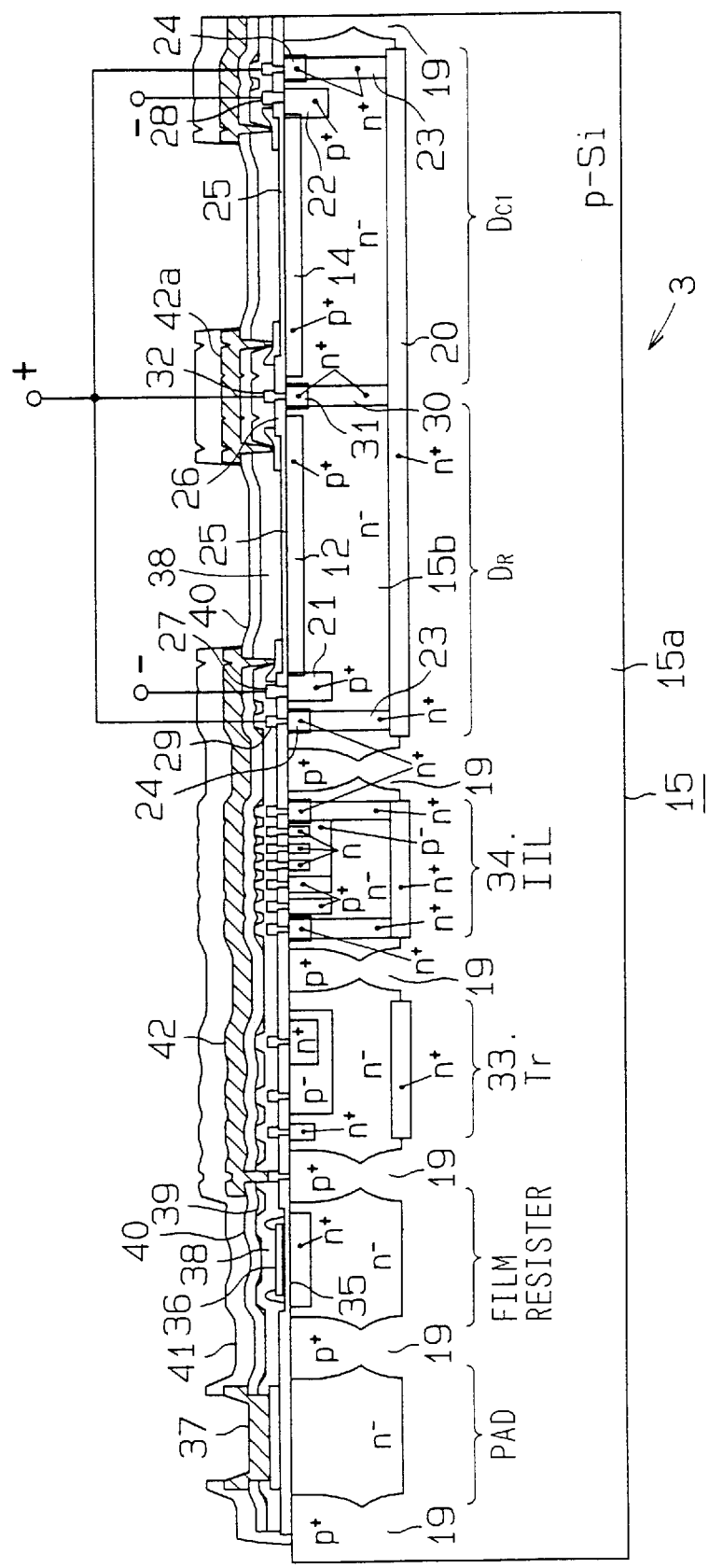
FIG. 5 is a sectional view taken along line V—V indicated in FIG. 3.

FIG. 5 shows a vertical section taken along line V-V indicated in FIG. 3, that is, a vertical section taken at the photodiodes $D_R$, $D_{C1}$ and the peripheral part thereof. The sectional structure of the sensor chip 3 will be described with reference to FIG. 5.

The n$^-$-type epitaxial layer 15b overlying the p-type silicon substrate 15a is formed with an island forming p$^+$-region 19, so that a large number of islands isolated by p-n junctions are defined in the n$^-$-type epitaxial layer 15b. The islands are formed with the light receiving elements (photodiodes), and circuit elements which constitute the signal processing circuit 16. In the island for forming the light receiving elements as shown in FIG. 5, a buried n$^+$-type region 20 is formed between the p-type silicon substrate 15a and the n$^-$-type epitaxial layer 15b. Besides, in the island for forming the light receiving elements, the p$^+$-type regions 12, 14 are formed in the surface layer parts of the n$^-$-type epitaxial layer 15b so as to be disposed away from each other, and p$^+$-type regions 21, 22 are respectively formed at the ends of the p$^+$-regions 12, 14. Further, in the island for forming the light receiving elements, n$^+$-type regions 23 which extend vertically and reach the buried n$^+$-region 20 are formed in the n$^-$-type epitaxial layer 15b. In the n$^+$-regions 23, n$^+$-type regions 24 are formed in the surface of the n$^-$-type epitaxial layer 15b. Besides, the surface of the silicon substrate 15 are formed with thin silicon oxide films 25 and a thick silicon oxide film 26, and they have aluminum electrodes (wiring lines) 27, 28 and an aluminum electrodes (wiring line) 29 arranged thereon in touch with the respective p$^+$-regions 21, 22 and with the n$^+$-regions 24.

Here in this embodiment, a deep n$^+$-type region 30 serving as a trap region is formed between the p$^+$-type regions 12, 14 of the respective photodiodes $D_R$, $D_{C1}$ in the island for forming the light receiving elements. The deep n$^+$-region 30 extends vertically in the n$^-$-type epitaxial layer 15b, and reaches the buried n$^+$-region 20. In the deep n$^+$-region 30, an n$^+$-region 31 is formed in the surface of the silicon substrate 15. Besides, an aluminum electrode (wiring line) 32 lying in touch with the n$^+$-region 31 is arranged on the surface of the silicon substrate 15.

The photodiodes $D_L$, $D_{C2}$ other than the photodiodes $D_R$, $D_{C1}$ are similarly constructed.

Regarding the signal processing circuit 16, a transistor 33 and an IIL (Integrated Injection Logic) element 34 are shown as the circuit element in FIG. 5. In the IIL element 34, p-type and n-type impurity diffused regions are formed and are wired using aluminum. Likewise, in the transistor 33, p-type and n-type impurity diffused regions are formed and are wired using aluminum. Further, a thin film resistor 36, adjusted by laser trimming, is fabricated on a silicon oxide film 35. More specifically, the thin-film resistor 36 is fabricated in such a way that a Cr-Si film or the like is formed by sputtering, and then patterned into a predetermined shape. Besides, aluminum wiring lines are connected to both the end parts of the laser trimming thin-film resistor 36. The thin-film resistor 36 is partially trimmed with a laser. Further, a pad 37 is fabricated.

Here, the circuit constituents, such as the transistor 33 and the IIL element 34, constituting the signal processing circuit 16 are fabricated on the silicon substrate 15 by diffusion or the like which are employed in conventional IC manufacturing method. The circuit constituents include, not only the transistor 33 and IIL element 34, but also the resistor 36, a capacitor or the like.

The aluminum wiring lines arranged on the silicon substrate 15 are covered with a TEOS oxide film 38, a BPSG film 39 and another TEOS film 40, which are covered with a surface passivation film (silicon nitride film) 41. Further, an aluminum film 42 serving as a light shielding film is arranged over a part for forming the signal processing circuit 16 (over parts for forming the circuit constituents 33, 34, etc.). The aluminum film 42 has the function of preventing the malfunctions of the circuit elements (33, 34). Namely, the malfunction of the signal processing circuit 16 is caused by the incident light. In this manner, the signal processing circuit 16 is shielded from light by the aluminum film 42 and is prevented from malfunctioning.

Here in this embodiment, an aluminum film 42a is arranged also between the p$^+$-type regions 12, 14 of the respective photodiodes $D_R$, $D_{C1}$. That is, the light shielding film 42a is interposed between the regions of the sensor chip 3 for forming the plurality of light receiving elements. Light projected on the area between the photodiodes is reflected by the aluminum film (light shielding film) 42a, and is not scattered. Therefore, scattered light does not reach the light receiving portions (the p$^+$-type regions 12, 14 in FIG. 5) of the photodiodes on both the sides (the photodiodes $D_R$, $D_{C1}$ in FIG. 5), and the outputs of these photodiodes are not influenced.

Besides, with the photodiodes $D_R$, $D_{C1}$ shown in FIG. 5, when light has radiated toward the photodiodes from outside, it reaches the p$^+$-type regions 12, 14 after passing through the silicon oxide films 40, 38, 25. When the light has entered the vicinities of the p-n junctions generated by the n-type epitaxial layer 15b and the p$^+$-type regions 12, 14, electron-hole pairs are created. Minority carriers created, that is, electrons and holes respectively created in the p$^+$-regions 12, 14 and in the n-type epitaxial layer 15b migrate (drift) in opposite direction to each other in both the p$^+$-type regions and the n-type epitaxial layer. Further, electric current is caused by the holes having reached the p$^+$-regions 12, 14 and the electrons having reached the n$^+$-regions 20, 23. That is, the current flows from the n-type epitaxial layer 15b toward the p$^+$-type regions 12, 14. The photocurrent is proportional to the amount of the incident light. The photocurrent (photo-detection signal) is transmitted to the signal processing circuit 16, and is subjected to predetermined signal processing in the signal processing circuit 16.

On the other hand, in a case where the deep n$^+$-region 30 for isolating the right and left sides is not formed in the structure in FIG. 5, some of the holes created by light having entered the p$^+$-region 14 on the right side reach the p$^+$-region 12 on the left side, for example. In contrast, when the deep n$^+$-region 30 for isolating the right and left sides is provided between the elements, plural electrons inhere in the deep n$^+$-region 30, so that the holes created by the light combine with the electrons and then, disappear in this place. Thus, the lifetime of the holes shortens. Consequently, the mutual influence between the light receiving elements $D_R$, $D_{C1}$ disposed adjacent to each other (light receiving regions 12, 14) in FIG. 5 is suppressed efficiently.

Meanwhile, as shown in FIG. 1, the sensor chip 3 is electrically connected with the terminals 6 through bonding wires 44. Besides, protective elements (capacitors) 45 are arranged between the adjacent terminals 6, so that when a high voltage is applied from the terminal 6, it is led to a ground through the protective element 45.

Referring to FIG. 2, the douser 5 is supported on the upper surface of the holder 8 over the sensor chip 3 so as to conceal this sensor chip 3.

The douser 5 is made of a light shielding material. In this embodiment, the douser 5 is made of resin, but it may be made of other material, for example, metal. The douser 5 is centrally formed with a through hole (slit) 46 which penetrates vertically, and which is circular so as to allow the light to pass therethrough. As shown in FIGS. 1 and 2, the douser 5 is mounted so that the through hole 46 is located concentric with the sensor chip 3 (light receiving portion 11).

Incidentally, as shown in FIG. 2, the sensor chip 3 and the wires 44 are covered with a moisture preventive material (potting material) 47.

In FIG. 2, the optical lens 4 is made of colored glass or resin (a translucent material) and is in a shape of a bowl (concave lens shape). The optical lens 4 is snugly fitted on the outer peripheral surface of the holder 8, and is supported by the housing 2 over the sensor chip 3. Further, the inner peripheral surface (lower surface) of the optical lens 4 is centrally formed with a recess 48, thus the optical lens 4 has a lens function. Incidentally, apart from such a concave lens, the aggregate lens (Fresnel lens) of a prism or the like also may be employed in order to endow the optical lens 4 with the lens function.

With the above construction, light incident onto the front surface side of the optical lens 2 in FIG. 4 passes through this optical lens 4, and then, is incident on the douser 5. Further, light having passed through the through hole 46 of the douser 5 is projected onto the photodiodes $D_R$, $D_L$, $D_{C1}$, $D_{C2}$ of the sensor chip 3 (refer to FIG. 3). More specifically, the light incident on the surface (optical lens 4) of the photo-detection sensor 1 has its optical path changed by the refractive index and shape of the lens material, it passes through the lens 4, is projected toward the sensor chip 3, and then, reaches the sensor chip 3 through the through hole 46 of the douser 5. Owing to the projection of the light, signals are outputted from the photodiodes $D_R$, $D_L$, $D_{C1}$, $D_{C2}$. Here, with respect to a light projection area on the sensor chip 3, a light projection area of light incident from the left side of the photo-detection sensor 1 is located on the right side of the sensor chip 3, and a light projection area of light from the right side of the photo-detection sensor 1 on the sensor chip 3 is located on the left side of the sensor chip 3.

Figure 6:
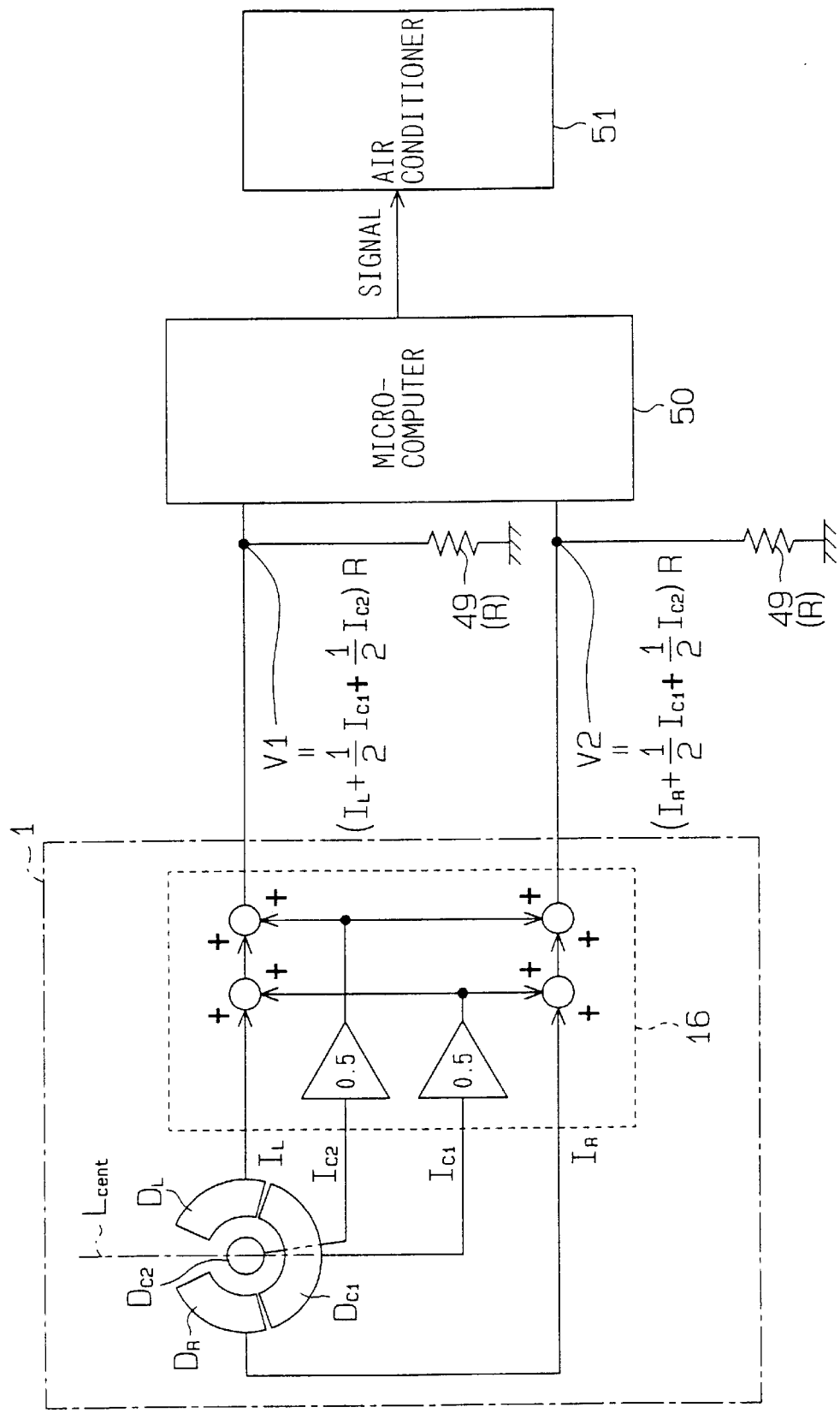
FIG. 6 is a diagram of an electrical architecture of an automatic air conditioning system.

FIG. 6 shows a diagram of the electrical architecture of an automatic air conditioning system.

The signal processing circuit 16 is connected to the four photodiodes $D_R$, $D_L$, $D_{C1}$, $D_{C2}$. In the signal processing circuit 16, an output current of the left detecting photodiode $D_L$ and one half of output currents of the central detecting photodiodes $D_{C1}$, $D_{C2}$ are added up, and the added value as output current of a left-incident light signal (=$I_L$+½·$I_{C1}$+½·$I_{C2}$) is subjected to current-to-voltage conversion by a resistor 49 (resistance; R). Then, the light signal converted to a voltage is transmitted to a microcomputer 50. Besides, an output current of the right-incident light detecting photodiode $D_R$ and the one half of the output currents of the central detecting photodiodes $D_{C1}$, $D_{C2}$ are added up, and the added value as an output current of a right-incident light signal ($=I_R+\frac{1}{2}\cdot I_{C1}+\frac{1}{2}\cdot I_{C2}$) is subjected to a current-to-voltage conversion by another resistor 49 (resistance; R). Then, the light signal converted to a voltage is transmitted to the microcomputer 50. That is, the left-incident light signal V1 is obtained from the output of the left-incident light detecting photodiode $D_L$, and the lowered outputs of the central detecting photodiodes $D_{C1}$, $D_{C2}$, while the right-incident light signal V2 is obtained from the output of the right detecting photodiode $D_R$, and the lowered outputs of the central detecting photodiodes $D_{C1}$, $D_{C2}$. Intensity of solar radiation and a side on which the solar radiation is impinging (the driver's seat or assistant driver's seat of the automobile) are determined by both the signals V1, V2. Concretely, the amount of solar radiation is detected as the summation of the outputs (=V1 + V2), and a direction is detected as an output ratio (=V1/(V1 + V2) or V2/(V1 + V2)).

An air conditioning unit 51 is connected to the microcomputer 50. The air conditioning unit 51 includes a blower, a cooler, a heater, etc., and it is installed inside the interior panel of the vehicle. The microcomputer 50 detects the amount of solar radiation and the direction (right or left) on the basis of the two signals V1, V2 explained above, and controls the air conditioning unit 51 from the right and left light intensities so as to increase the amount of blown air and lower the temperature of the side on which the solar radiation impinges (the driver's seat or the assistant driver's seat). In this way, the right and left independent air-conditioning controls of the car air conditioner is performed.

Next, an embodiment of a method of manufacturing a sensor chip will be described with reference to FIGS. 7–12 and FIG. 5.

Figure 7:
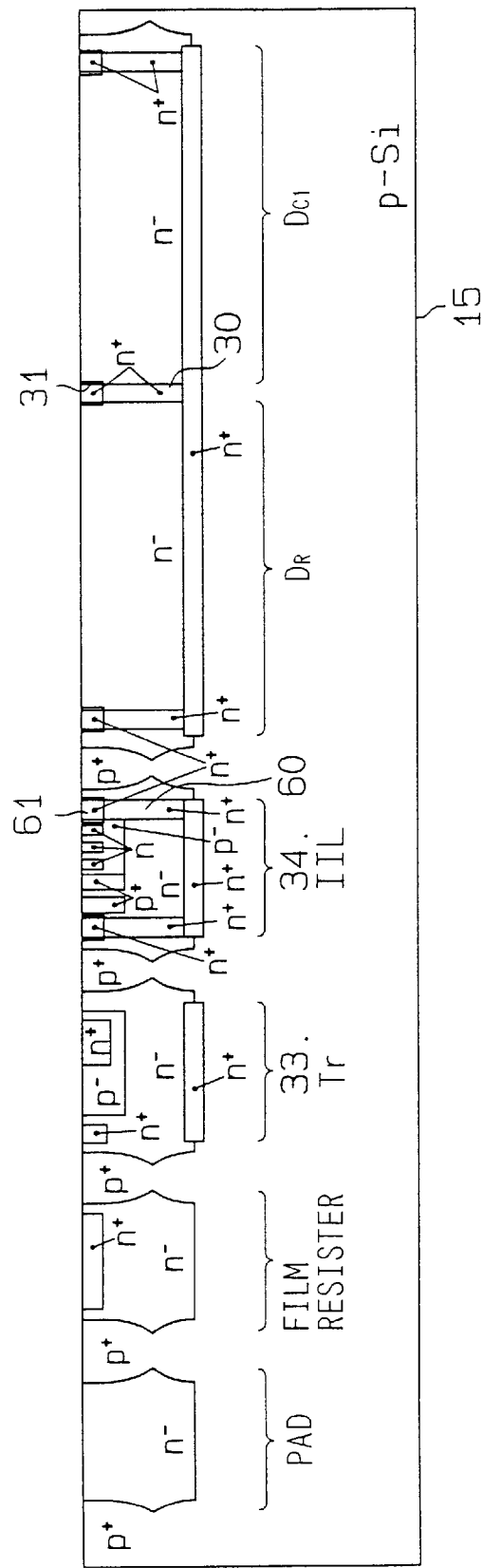
FIG. 7 is a sectional view showing a manufacturing step of a sensor chip.

As shown in FIG. 7, a silicon substrate 15 is prepared, and circuit constituents such as the bipolar transistor 33, the IIL element 34, the diodes, the diffused resistors and capacitors are fabricated on the silicon substrate 15 by a semiconductor process such as photolithography, implantation and diffusion. In this process, in case of forming a deep n$^+$-region 60 for fabricating the IIL element 34, a deep n$^+$-region 30 for isolating photodiodes is formed simultaneously. Also, in case of forming an n$^+$-region 61 for a contact, for fabricating the IIL element 34, an n$^+$-region 31 for a contact is formed simultaneously.

Figure 8:
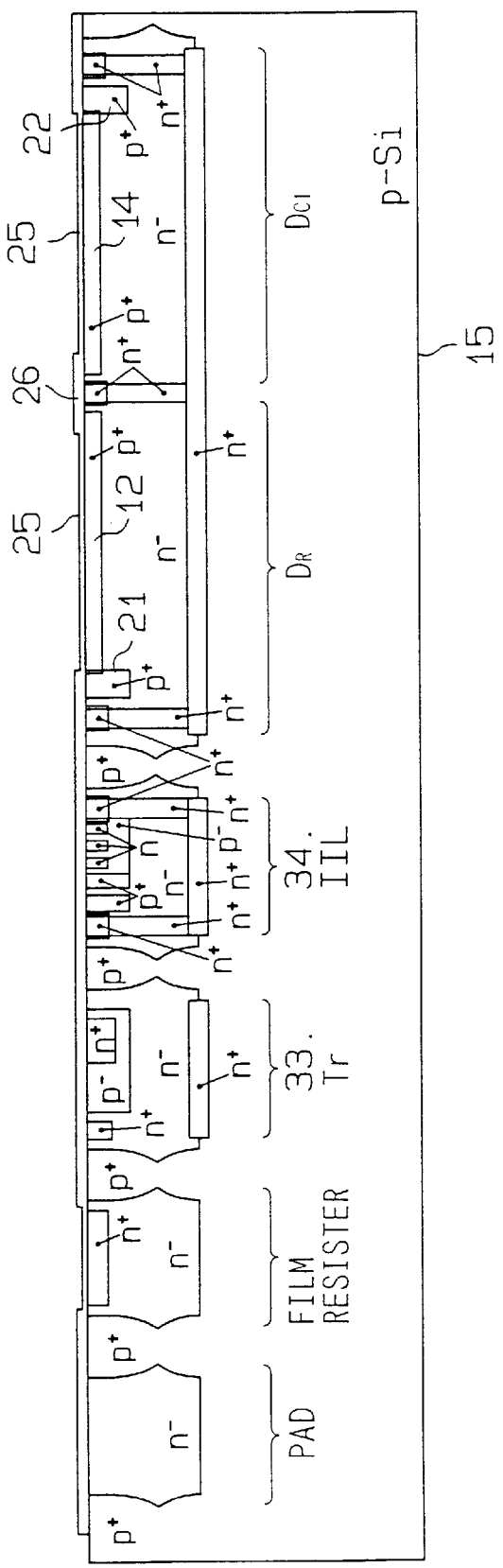
FIG. 8 is a sectional view showing a manufacturing step of the sensor chip.

Besides, as shown in FIG. 8, a silicon oxide film 26 is formed on the silicon substrate 15, and the regions of the silicon oxide film 26 to become light receiving portions are selectively removed by photolithography, so as to form thermal oxidation films 25. Further, p$^+$-type regions 12, 14, 21, 22 are formed by ion implantation and diffusion, thereby forming the photodiodes $D_R$, $D_{C1}$ (and $D_L$, $D_{C2}$) which are employed as light receiving elements.

Figure 9:
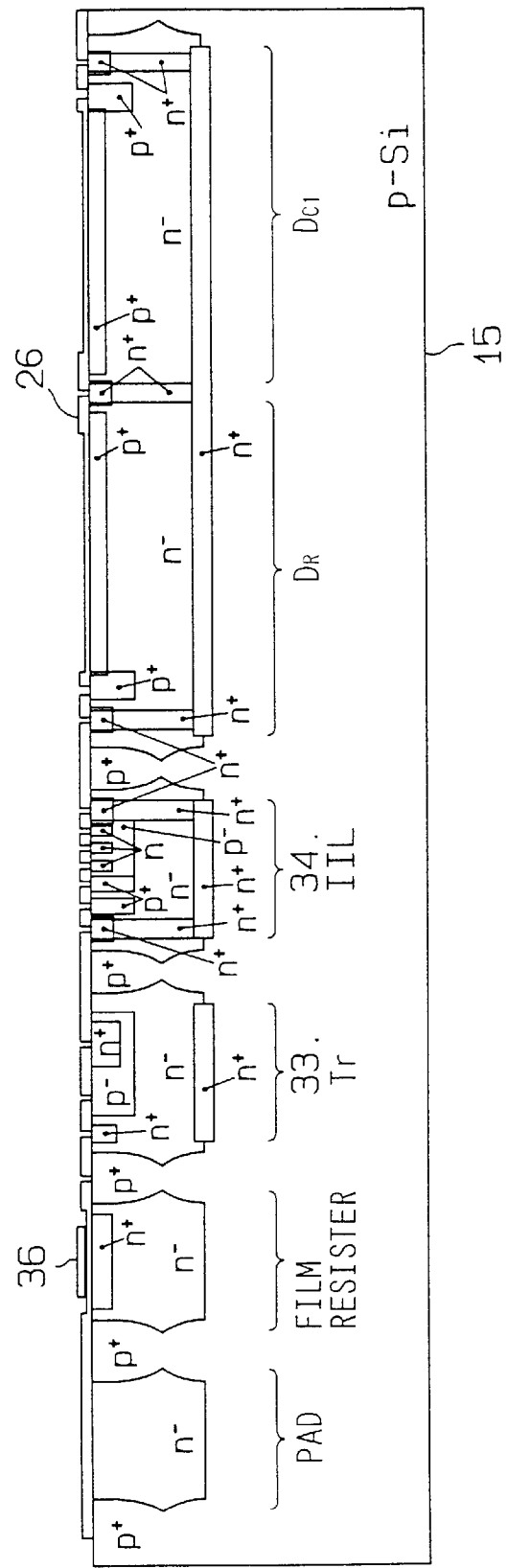
FIG. 9 is a sectional view showing a manufacturing step of the sensor chip.

Thereafter, as shown in FIG. 9, Cr—Si is formed into a film by sputtering, and the film is patterned into a predetermined shape by photolithography, thereby forming a thin film resistor 36. Besides, a contact forming region in the silicon oxide film 26 is removed (the film 26 is provided with an opening).

Figure 10:
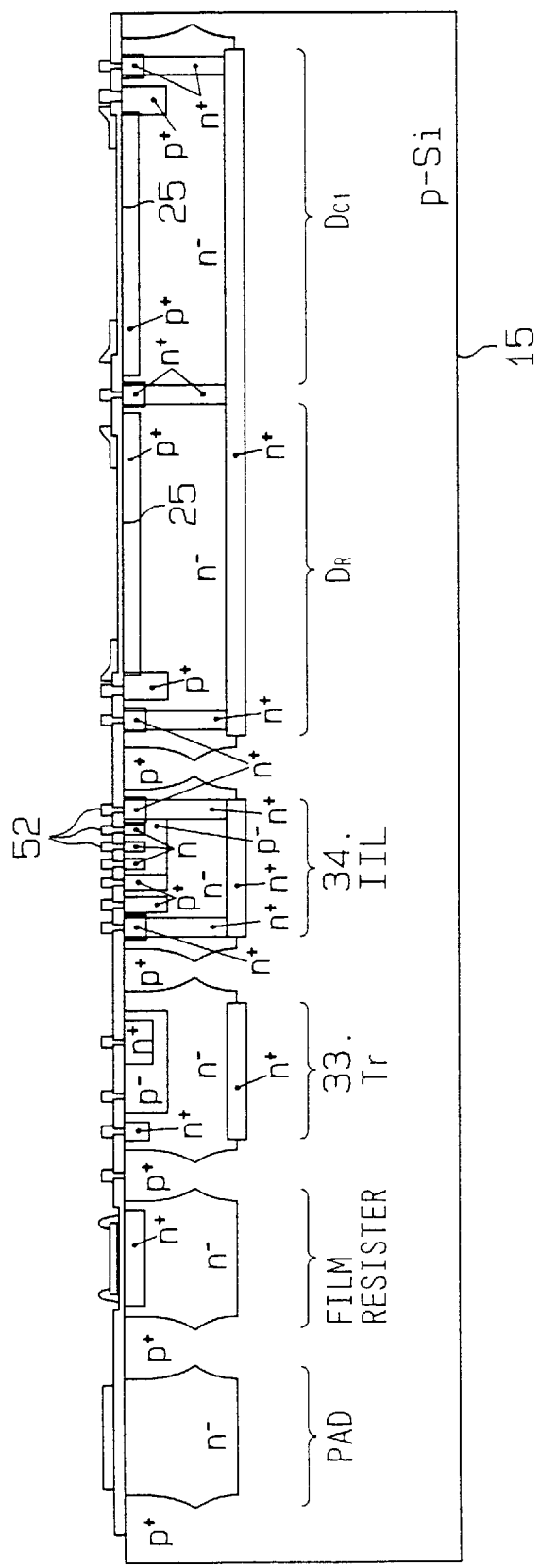
FIG. 10 is a sectional view showing a manufacturing step of the sensor chip.

Further, as shown in FIG. 10, an aluminum film which is a first metal having a thickness of 1.1 μm is formed and is patterned by photo-etching, thereby forming the wiring lines (electrodes) 52 of the circuit constituents. At this patterning, the aluminum film covering the thermal oxidation films 25 on the light receiving portions are also removed by etching.

Figure 11:
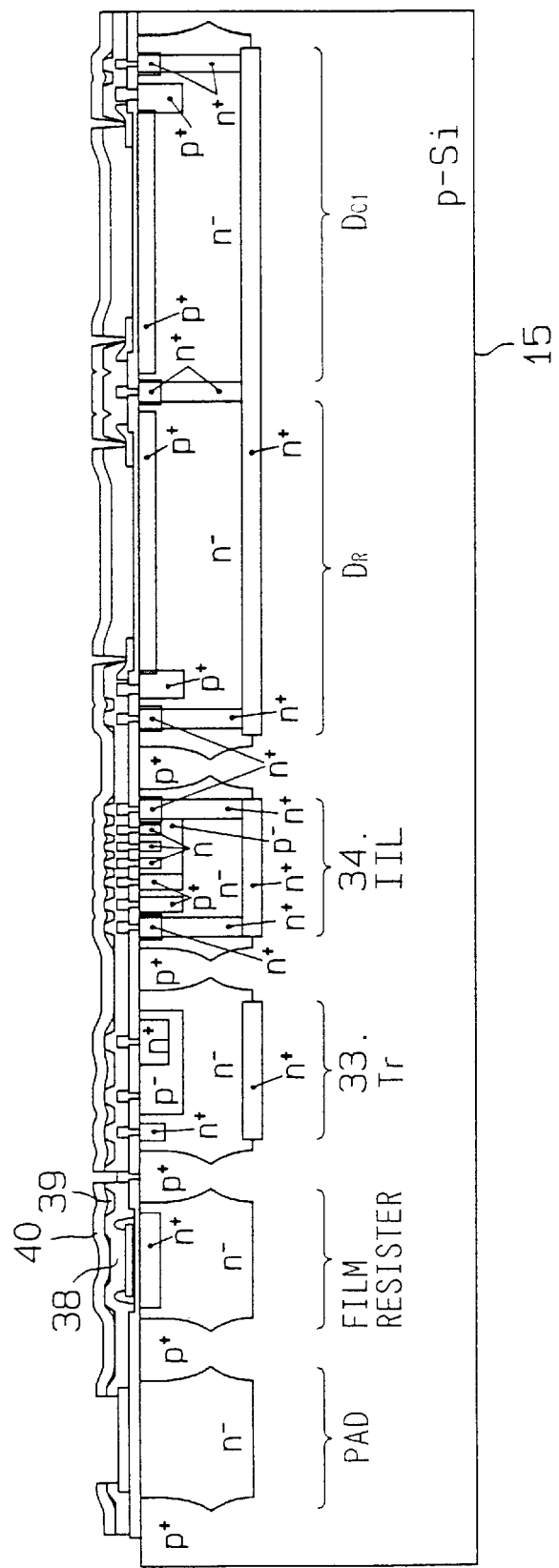
FIG. 11 is a sectional view showing a manufacturing step of the sensor chip.

Thereafter, as shown in FIG. 11, interlayer insulating films which consist of a TEOS film (silicon oxide film) 38, a BPSG film (silicon oxide film) 39 and another TEOS film 40 are formed, and parts of the interlayer insulating films 38, 39, 40 are provided with openings by etching.

Figure 12:
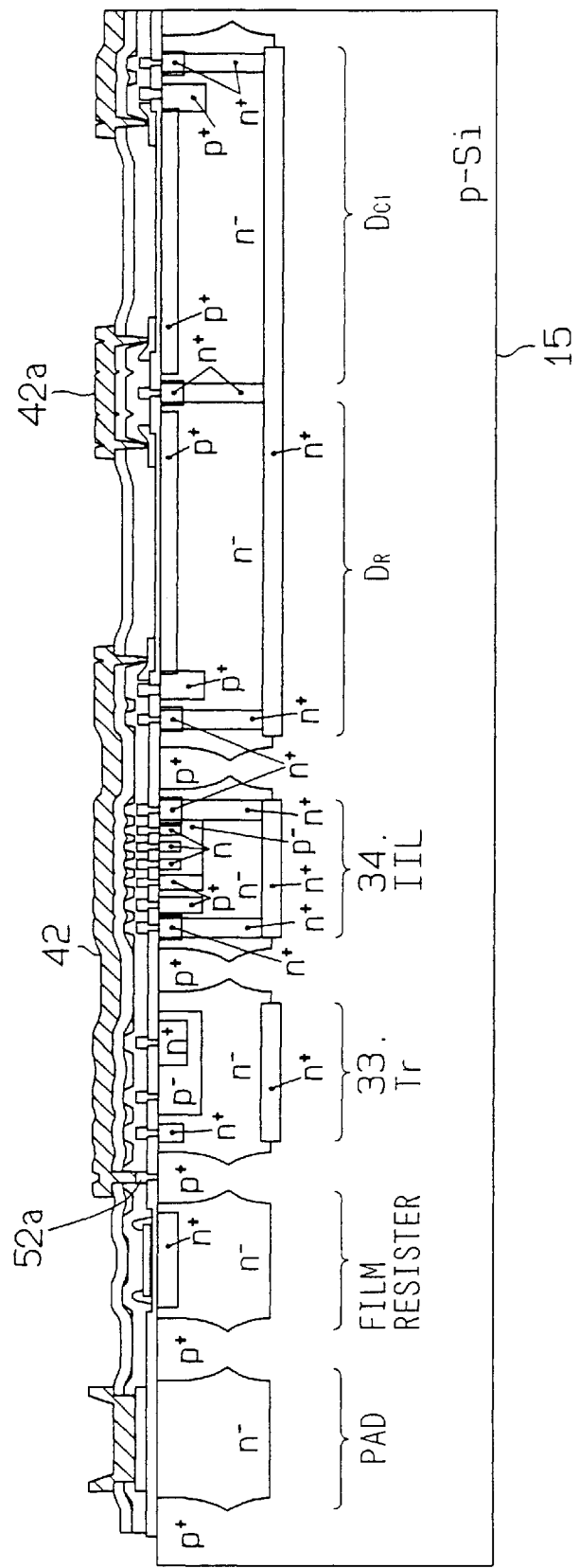
FIG. 12 is a sectional view showing a manufacturing step of the sensor chip.

Subsequently, as shown in FIG. 12, an aluminum film 42 which is a second metal thin film having a thickness of 1.3 μm is formed and is patterned into the light shielding film 42 to become a light shielding film. When arranging the light shielding film 42, a light shielding film 42a is left over areas between the photodiodes in order to prevent these photodiodes from malfunctioning due to the impingement of light over these areas.

Incidentally, the aluminum film 42 is connected with an aluminum film 52a through the openings of the interlayer insulating films 38, 39, 40.

Besides, as shown in FIG. 5, a silicon nitride film 41 as a protective film is formed to have a thickness of 1.6 μm by CVD and is patterned, and those parts of the silicon nitride film 41 which cover the light receiving portions are removed by dry etching.

The optical IC thus manufactured has thereafter is adjusted output thereof in every chip. Concretely, the thin film resistor 36 made of the material Cr—Si is adjusted by laser trimming.

Incidentally, in the optical IC which is manufactured by the above processing steps, the bipolar transistor 33, IIL element 34, diffused resistors, diodes, and capacitors which utilize a depletion layer capacitances of p-n junction are arranged under the light shielding film 42, whereas the thin film resistor 36 which is adjusted by the laser trimming is arranged outside the light shielding film 42.

Besides, thin film resistor which is not adjusted by the laser trimming and which is not influenced by the impingement of light, and capacitors which do not utilize the depletion layer capacitance of the p-n junction (for example, a MOS-type capacitor which is formed with semiconductor substrate and a electrode layer with an oxide film interposed therebetween) can be arranged outside the light shielding film 42. Thus, probability of defects, such as insulation failure between the light shielding film 42 and the circuit constituent wiring lines, is reduced. In an actual layout, however, demerits such as longer wiring lines for leading out the circuit constituents out of the light shielding film 42 are sometimes more serious, and these circuit constituents may be located either under the light shielding film 42 or outside it.

The embodiments thus far described have features stated below.

(A) Regarding a sensor structure, as shown in FIG. 5, a photo-detection sensor, in which a plurality of photodiodes (light receiving elements) $D_R$, $D_L$, $D_{C1}$, $D_{C2}$ are built within one chip, has the feature (1) that deep n$_+$-type regions (trap regions) 30 for trapping carriers created with the impingement of light in the plurality of photodiodes $D_R$, $D_L$, $D_{C1}$, $D_{C2}$ are formed between regions for forming the photodiodes $D_R$, $D_L$, $D_{C1}$ $D_{C2}$ in the sensor chip 3, and has the feature (2) that aluminum films (light shielding films) 42a are arranged between the regions for forming the photodiodes $D_R$, $D_L$, $D_{C1}$ $D_{C2}$ in the sensor chip 3. As the detailed construction of the feature (1), the plurality of photodiodes (light receiving elements) is such that a plurality of p-type regions 12, 14 each corresponding to one light receiving element are formed in the surface layer of an n-type region 15b common to all the light receiving elements, and that the electrodes 27, 28 of the corresponding elements are arranged for the respective p-type regions 12, 14. Each of the trap regions 30 is a heavily-doped n-type region which is formed between the adjacent p-type regions 12, 14 in the n-type region 15b. Moreover, a buried heavily-doped n-type region 20 is formed in the bottom of the n-type region 15b within the chip 3, and the trap region 30 reaches the buried heavily-doped n-type region 20.

The carriers created with the impingement of light in the photodiodes $D_R$, $D_L$, $D_{C1}$, $D_{C2}$ are trapped by the deep $n^+$-regions (trap regions) 30 in the construction of the feature (1). In this way, the crosstalks between the light receiving elements are suppressed, and the respective light receiving elements can be operated independently. Besides, when the elements are made independent by forming islands which are isolated by p-type isolation layers, the isolation distances between the elements lengthen to enlarge a chip size. In the embodiment, however, the enlargement of the chip size can be avoided owing to a construction in which one photodiode is not disposed in one island, but the plurality of photodiodes are fabricated in one island and are isolated by the deep $n^+$-region (trap region) 30.

Besides, since the deep $n^+$-type region 30 is diffused deep enough to reach the buried $n^+$-type region 20, it can perfectly isolate the right-incident and left-incident light receiving elements.

Further, owing to the aluminum film (light shielding film) 42a in the construction of the feature (2), it is evitable that light incident on the area between the photodiodes undergoes scattering etc., so that scattered light does not reach the light receiving portions of the photodiodes on both the sides, and the outputs of the photodiodes are not influenced. In this manner, the adjacent light receiving elements are optically isolated efficiently, and the respective light receiving elements can be operated independently.

Incidentally, it is also allowed to employ a structure adopting only the feature (1) or a structure adopting only the feature (2).

(B) Regarding a method of manufacturing a sensor, as shown in FIG. 7, in fabricating an element 34 which constitutes a signal processing circuit 16, deep $n^+$-regions (trap regions) 30 for trapping carriers created with the impingement of light in a plurality of photodiodes $D_R$, $D_L$, $D_{C1}$, $D_{C2}$ are formed simultaneously between regions for forming the photodiodes. Therefore, the trap regions 30 can be formed without adding any dedicated step for forming these trap regions. That is, the number of steps is prevented from increasing by forming the deep $n^+$-regions 30 as the isolation layers, simultaneously with deep $n^+$-regions 60 of the IIL element 34 (by performing diffusion at the same time). Moreover, isolation structures can be made smaller than in case of employing p-type isolation layers.

(C) Regarding the method of manufacturing a sensor, as shown in FIG. 12, in arranging an aluminum film (light shielding film) 42 on the signal processing circuit 16, aluminum films (light shielding films) 42a are simultaneously arranged between the regions for forming the photodiodes. Therefore, the light shielding films 42a can be arranged between the elements without adding any dedicated step for arranging these light shielding films 42a between the regions for forming the photodiodes. In this way, the adjacent elements optically influence little on each other, and an integrated optical sensor which is easily manufactured and which isolates the elements favorably can be obtained.

Although the light receiving elements have been described as the photodiodes in the foregoing, they may well be, for example, phototransistors.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A photo-detection sensor, comprising:

a plurality of light receiving elements built in one chip, each of which has a p-type region formed in a surface layer of a common n-type region, and has an electrode arranged on the corresponding p-type region;

at least one trap region which traps carriers generated with projection of light in said plurality of light receiving elements, and which is formed in a part of the common n-type region interposed between adjacent light receiving elements of said plurality of light receiving elements, said trap region having a heavily-doped n-type region which is formed in the n-type region; and a buried heavily-doped n-type region formed in a bottom part of said common n-type region, wherein said trap region reaches said buried heavily-doped n-type region.

2. A photo-detection sensor according to claim 1, further comprising:

at least one light shielding film which is arranged on an area between the adjacent light receiving elements of said plurality of light receiving elements.

3. A method of manufacturing a photo-detection sensor, comprising:

preparing a semiconductor substrate having an n-type layer formed thereon;

forming a plurality of light receiving elements in a surface portion of the n-type region, each of which includes p-type region; and forming at least one trap region simultaneously with a circuit constituent which constitutes a signal processing circuit for processing signals of said plurality of light receiving elements, wherein said trap region traps carriers generated with projection of light in said plurality of light receiving elements, and is formed in a part between adjacent light receiving elements of the plurality of light receiving elements, and said trap region is composed of a heavily-doped n-type region;

forming a buried heavily-doped n-type region formed in a bottom part of said n-type region so that said trap region reaches said buried heavily-doped n-type region.

4. A method of manufacturing a photo-detection sensor according to claim 3, wherein said circuit constituent which constitutes said signal processing circuit is an integrated injection logic element.

5. A method of manufacturing a photo-detection sensor according to claim 4, further comprising:

forming a light shielding film for covering said signal processing circuit and an area between adjacent regions for forming said light receiving elements.

* * * * *